United States Patent [19]

Riha

[11] Patent Number: 4,618,841
[45] Date of Patent: Oct. 21, 1986

[54] ELECTRONIC COMPONENT FUNCTIONING WITH REFLECTED ACOUSTIC WAVES

[75] Inventor: Gerd Riha, Munich, Fed. Rep. of Germany

[73] Assignee: Siemens Aktiengesellschaft, Berlin & Munich, Fed. Rep. of Germany

[21] Appl. No.: 699,949

[22] Filed: Feb. 8, 1985

Related U.S. Application Data

[63] Continuation-in-part of Ser. No. 520,418, Aug. 4, 1983, Pat. No. 4,520,330.

[30] Foreign Application Priority Data

Aug. 12, 1982 [DE] Fed. Rep. of Germany ....... 3230038
Feb. 9, 1984 [DE] Fed. Rep. of Germany ....... 3404618

[51] Int. Cl.[4] ...................... H03H 9/145; H03H 9/42; H03H 9/64
[52] U.S. Cl. ............................... 333/195; 310/313 D; 333/153; 333/194; 333/196
[58] Field of Search ................... 333/150–155, 333/193–196; 310/313 R, 313 A, 313 B, 313 C, 313 D; 364/821

[56] References Cited

U.S. PATENT DOCUMENTS

4,365,220 12/1982 Hikita .............................. 310/313 C
4,403,165 9/1983 Ballato et al. .................. 310/313 D Primary Examiner—Marvin L. Nussbaum
Attorney, Agent, or Firm—Hill, Van Santen, Steadman & Simpson

[57] ABSTRACT

An electronics component operating with reflected acoustic waves having a division of weighted reflector fingers into respective sequences of sub-pieces which have a weighting offset relative to one another. A continuation of the fingers extending beyond a principal path is provided by additional, weighted sub-pieces. The additional weighted sub-pieces are at least a fundamental repetition of the sequence of sub-pieces of the corresponding weighted finger of the principal path. The additional sub-pieces are provided in view of distortions which occur causing the waves to follow a path which laterally deviates from the principal path.

7 Claims, 6 Drawing Figures

ELECTRONIC COMPONENT FUNCTIONING WITH REFLECTED ACOUSTIC WAVES

RELATED APPLICATION

This application is related to co-pending application, U.S. Ser. No. 520,418, filed Aug. 4, 1983, now U.S. Pat. No. 4,520,330, issued May 28, 1985 of the same inventor, titled "ELECTRONIC COMPONENT FUNCTIONING WITH REFLECTED ACOUSTIC WAVES", and is a continuation-in-part of such earlier application.

BACKGROUND OF THE INVENTION

The present invention relates to an electronic component functioning with reflected acoustic waves on a substrate, said substrate having a reflector structure having finger weighting associated therewith.

A surface wave filter designed as a dispersive delay line and an improvement relating to such a filter are disclosed in German Patent application No. P 31 21 516.5, corresponding to U.S. Ser. No. 377,466, now U.S. Pat. No. 4,427,954; Nos. P 32 09 948.7; and P 32 09 962.2, all incorporated herein by reference. Particularly in the case of the above cited second and third applications, an electronic component functioning with acoustic waves is provided whereby the finger weighting employed to achieve a specific, prescribed transfer function is achieved such that a spacing of finger groups from one another and/or of individual fingers from one another is varied relative to a position of the fingers which would correspond to such a component without finger weighting. In the first cited patent application this finger weighting is realized by means of finger length weighting fundamentally known per se. The non-equidistant spacings of fingers or finger groups from one another in this component serve to achieve a prescribed dispersion of said component.

The invention of the German application No. P 32 09 962.2 offers the advantage (apart from a dispersion realized in this component) of providing the finger weighting necessary for the prescribed amplitude function of the transfer characteristic such that the active portions of the individual fingers of the respectively employed digital structure (structures) extends over the entire width of the working area of the electronic component, i.e. over the entire width of the structure (structures) at right angles relative to the primary propagation direction of the acoustic wave. Despite the presence of a finger weighting, disruptive side effects which are connected with finger length weighted structures or with finger dot weighted structures should be avoided.

In the extreme case, given an electronic component according to German application No. P 32 09 962.2, a shift of respectively adjacent fingers relative to one another can be provided in order to realize the necessary finger weighting (related to a non-weighted structure), i.e. a respective finger group to be subjected to finger weighting consists of only two fingers. Thus, maximum band width is achieved for a structure or for a component according to this earlier invention.

In co-pending U.S. Ser. No. 520,418, a finger weighting for an electronic component functioning with reflected acoustic waves is provided which (just like the finger weighting according to the earlier invention of the application No. P 32 09 962) is free of disruptive side effects, and nonetheless allows the greatest possible (in comparison to a component without finger weighting) or even greater band width in comparison to the system in application No. P 32 09 962.

Given an electronic component as previously described in Ser. No. 520,418, the fingers of the reflector structure to be weighted are functionally divided at least once in their longitudinal direction so as to create sub-fingers. The sub-fingers are offset relative to one another in a primary wave propagation direction by a dimension corresponding to a prescribed weighting.

The invention in Ser. No. 520,418 is based on the consideration that even greater band width of the respective digital structure or of the entire component can only be achieved in comparison to the earlier invention by following a relatively different solution. For this different solution, one can begin with a known electronic component functioning with acoustic waves and, for example, from a component of the earlier application No. P 31 21 516 as well which exhibits varied finger spacings for the realization of a dispersion.

The invention in Ser. No. 520,418 is based on the idea of providing a "finger displacement" which will already influence the individual fingers or the respective individual finger as a finger weighting. The underlying principle of this solution consists of dividing the respective individual finger to be subjected to a finger weighting in a corresponding structure of the electronic component at least once in the longitudinal direction of the finger and to position the at least two parts which have arisen parallel to the primary wave propagation direction in offset manner relative to one another. The primary wave propagation direction is the intended direction in which the acoustic wave proceeds in the electronic component. Given a component with 180° reflection, this is usually a single direction. Given a component with wave reflection differing from 180°, for example having 2×90° wave reflection (with reflection fingers placed obliquely at an angle of 45°), one primary wave propagation direction then exists which is traversed in the forward direction and parallel thereto in the return direction and a further primary wave propagation direction exists which runs at right angles thereto. Given the latter design of the electronic component, the offset of the finger parts can be realized parallel to one primary wave propagation direction or to the other primary wave propagation direction, or partially to the one and partially to the other primary wave propagation direction. The longitudinal direction of said fingers mentioned in conjunction with the division of the individual fingers is the direction of the largest geometrical dimension of the individual fingers. Given a component with 180° reflection, this longitudinal direction of the finger is usually orthogonal relative to the primary wave propagation direction. Given a component with a bent path of the wave propagation of the acoustic wave, the longitudinal direction of the corresponding finger given, for example 90° reflection in the component, usually proceeds at an angle of 45° relative to the one and to the other primary wave propagation direction (homogeneous or isotropic conditions assumed).

SUMMARY OF THE INVENTION

It is an object of the present invention to specify an improvement for an electronics component having mutually offset sub-pieces of reflector elements whereby disadvantages based on adjustment imprecision and/or disturbing temperature influences, such as can occur given U.S. Ser. No. 520,418, can be eliminated.

For such a component, this object is achieved by providing additional reflector element sub-pieces which are positioned outside edges of a principal path and lie within a deviated path above or below the principal path which occurs as a result of disturbing influences such as adjustment imprecisions, disturbing temperatures, or the like.

DESCRIPTION OF THE PREFERRED EMBODIMENTS

Figure 1:
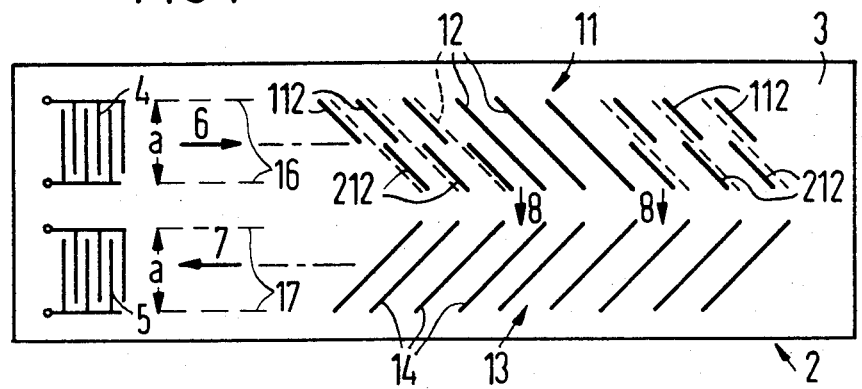
FIG. 1 is a plan view of a preferred embodiment of an electronic component according to the invention wherein a substrate is provided having transducers for transmitting and/or receiving acoustic waves and wherein a reflector structure with finger weighting is provided on the substrate.

FIG. 1 shows a fundamental embodiment of an electronic component functioning with reflected acoustic waves having wave reflection at angles differing from 180°. The illustrated structures or the existing electrode fingers are preferably metallization strips which are situated on the upper surface 3 of the substrate body 2 in FIG. 1. Two known inter-digital transducer structures are referenced 4 and 5. In the one structure, an acoustic surface wave is generated from the electric input signal in the piezo-electric material of the surface 3 of the substrate body 2. An electric signal can be regained from the received acoustic wave with the other of these transducers. The electric input signal and output signal differ from one another in accordance with the transfer function provided for this com- ponent.

Given the Example of FIG. 1, the transducer 4 is assumed to be the input and the transducer 5 is assumed to be the output so that primary wave propagation directions as indicated by the arrows 6, 7, and 8 result. The acoustic wave thus proceeding in the direction of arrow 6 strikes a first reflection digital structure 11 which consists of a plurality of reflection fingers 12 placed obliquely in a manner known per se. After the reflection in the direction of the arrow 8 accomplished at these fingers, the acoustic wave strikes the second, illustrated reflection digital structure which consists of a plurality of reflector fingers 14 again placed obliquely. After reflection accomplished at this structure 13, the wave proceeds or the primary wave propagation direction proceeds parallel to the direction of arrow 7.

Width dimension a of the reflector structure is identical to the active width of the excited acoustic wave. Diffraction effects due to the actually occurring dimensions are not considered here. The dimension a, for example, corresponds to the unweighted overlap length of the interdigital fingers of the illustrated transducer 4. Given (input) transducers of a different type such as, for example, shearing vibration transducers (for volume waves and the like), their active width is the determining factor for the width dimension a. Given an exact wave propagation direction 6, it would be sufficient (and this has been the practice up to now) to make the reflector structure 111 at least not significantly wider than this dimension a. The sides having the width a are indicated with the lines 16 and 17, respectively.

The respective length of a reflection digital structure 11, 13 is based in a known manner on the prescribed demands which are made of the corresponding electronic component.

In FIG. 1, the reflection digital structure 11 contains a finger weighting with which the prescribed transfer function of the component is met in view of the amplitude function. A required dispersion property given a component according to FIG. 1 can be realized by means of non-equidistant spacings of individual fingers or finger groups relative to one another. These spacings refer to a position of the individual fingers of a digital structure which has no dispersion (and no finger weighting by means of finger displacement according to the earlier invention). Given the example of FIG. 1, such a non-dispersive, non-weighted reflection digital structure is shown with the structure 13. However, it should be noted that the structure 13 given in the example of FIG. 1 could also be provided a dispersive and/or a weighted property by means of mutual cross-displacement.

In FIG. 1, those electrode fingers 12 which must exhibit a corresponding weighting are divided once in length so that two respective sub-fingers 112, 212 result. These two sub-fingers are displaced relative to one another by the dimension resulting from the required weighting, namely parallel to the primary wave propagation direction 6 in FIG. 1. As is standard for finger weighting, this finger weighting is distributed as a modulation over the entire reflection digital structure 11 (provided with finger weighting). A finger weighting of a zero location (which would correspond to an overlap "zero" given known overlap weighting) derives for a displacement of the sub-fingers 112 and 212 relative to one another by the dimension $\lambda/2$. An offset of the two finger parts 112 and 212 by the quantity "zero", i.e. as exists given the fingers 12 in the center of the structure 11, corresponds to a transfer maximum or a complete overlap. As a result of less pronounced interference, intermediate values of the offset of the finger parts 112, 212 relative to one another produce the corresponding intermediate values of a finger weighting between transfer maximum and minimum. Let it be pointed out here that the respective component parallel to the corresponding primary wave propagation direction (here the direction of arrow 6) is the respective governing factor for the offset. Given the sample embodiment of FIG. 1, this is the projection onto the direction of arrow 6 due to the oblique position of the fingers 12.

Figure 2:
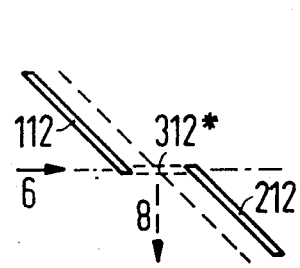
FIG. 2 is a first embodiment of a finger weighting of said first sub-fingers forming a portion of the structure illustrated in FIG. 1 and wherein the fingers are displaced horizontally.
Figure 3:
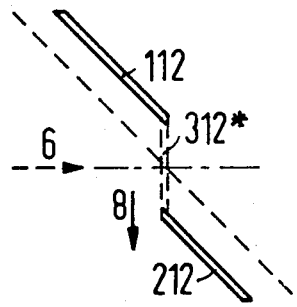
FIG. 3 is a second embodiment of finger weighting wherein the finger sub-pieces are displaced vertically.
Figure 4:
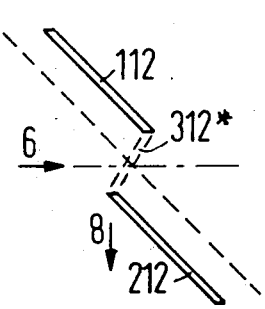
FIG. 4 is a third embodiment wherein finger sub-pieces are displaced both horizontally and vertically.

Shown next to one another for one finger (for example for a finger 12) of a component with obliquely directed reflection digital structure, FIGS. 2, 3 and 4 illustrate three possibilities of the finger weighting offset according to the invention. FIG. 2 (as in FIG. 1) shows the offset parallel to the direction of the arrow 6.

FIG. 3 illustrates the offset (only) in the direction parallel to the direction of arrow 8. And FIG. 4 shows an offset partially parallel to the direction of arrow 6 (or 7) and partially parallel to the direction of the arrow 8. It is particularly the technique corresponding to FIG. 2 which is suitable for minimizing conceivable disruptions because no spacing therefor between the sub-fingers 112, 212 appears in the running direction of the wave. It should be pointed out concerning FIGS. 2 through 4 that they are significantly enlarged sections in comparison to the scale of FIG. 1.

As already indicated above, the other reflection digital structure 13 (instead of the reflection digital structure 12) can have the inventive finger weighting (described above relating to structure 11). The necessary finger weighting can also be divided between both reflection digital structures 11, 13. Correspondingly divided, it thus can be achieved that the required finger offset is smaller.

A single, respective finger can also be divided over its length into more than only two finger parts 112, 212. A multiple subdivision of a respective finger in the longitudinal direction allows greater sophistication of the corresponding structure to be achieved, while accepting a corresponding, additional technological expense.

Let it also be pointed out that the sub-pieces 112, 212 belonging to a finger 12 can be connected to one another (312\*), as shown with broken lines in FIGS. 2-4. Additional effects due to such a connection 312\* are generally negligible, particularly given substrate material having a low coupling factor $k^2$. The respective spacings between the neighboring ends of the respective sub-pieces 112, 212, or the lengths of the individual connections are one or more orders of magnitude smaller than the length of the reflector elements 12 or sub-pieces 112, 212. Given arrangements having metallization strips, currents flowing through these connections are to be taken into consideration, specifically given a high coupling factor.

The propagation direction (FIG. 1, arrows 6, 7, or 8) of an acoustic wave excited in the component is dependent not only on the position and orientation of the (input) transducer generating the wave but also on anisotropic properties of the substrate body and/or temperature variations thereof. For example, given lithium niobate as a substrate body 2, there is a pure mode axis relative to which the transducers, i.e. the principal wave propagation direction, are adjusted in particular. An error in adjustment which can hardly be avoided to a more or less great degree leads to the fact that the actual wave propagation direction 6' as shown on FIG. 5 proceeds somewhat at a slant relative to the orientation 6 of the transducer 4 operated as an input. Given the assumption of correct adjustment, however, the transducer 4 and the reflector structure 11 and, in addition, the remaining structures as well are disposed as though the desired propagation direction 6 were exactly present.

As a result of the anisotropy of the substrate body 2, the propagation speed $v_x$ of the acoustic wave in the propagation direction referenced 6 (or, respectively 7) is not the same as the speed of sound $v_y$ in the direction referenced 8. The angle of reflection of the reflection at the reflector elements 12 (or 14), however, depends on the ratio $v_x/v_y$.

Also, $v_x$ and $v_y$ have different temperature behavior, so that the actual angle of reflection is a function of the temperature. When the actual direction of the wave propagation 6 does not already deviate from the prescribed direction (particularly as a consequence of an imprecision in adjustment), the result is that the intended direction of the wave propagation 7 of the acoustic wave entering into the output transducer is (likewise) no longer exactly observed, given temperature fluctuations.

Figure 5:
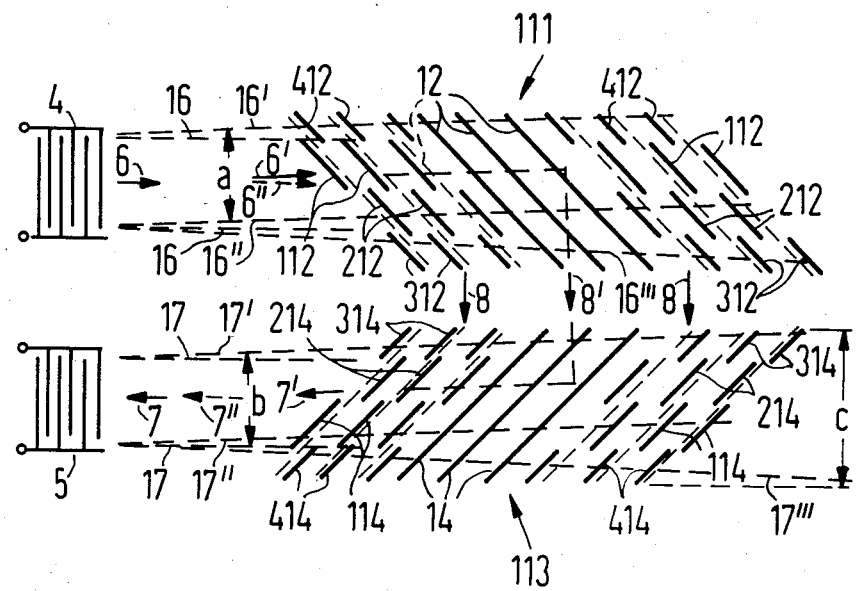
FIG. 5 is an embodiment of the invention showing the use of additional sub-pieces to compensate for a deviation in actual acoustic wave paths due to disturbances or defects associated with the acoustic wave component.

Elements present in FIG. 5 that coincide with FIG. 1 bear the reference characters already cited above.

The embodiment of the invention in FIG. 5 is designed such that a number of the deficiencies cited above can be eliminated or compensated.

Let it be assumed here, for example as a consequence of an error in adjustment (for example, the alignment of the fingers of the transducer 4 is faulty relative to the crystal orientation of the substrate 2), that the acoustic wave having the width a does not proceed from the input transducer 4 in the rated direction. Rather, it proceeds in the direction 6' which has an angle of a few angular minutes relative to the direction 6 or relative to the axis of the reflector structure 111. The acoustic wave proceeding in the direction 6' thus proceeds obliquely (up, in the illustration of FIG. 5) relative to the reflector structure 111. Given an arrangement of FIG. 1, this means that components of the acoustic wave in the region of the upper edge 16' of the obliquely proceeding wave either will not impinge fingers of the reflector structure 11 (FIG. 1) at all and/or an imbalance will result. This imbalance would also appear when a structure 11 of FIG. 1 for which a greater width a is provided were to be employed. As may be seen from FIG. 5, with the invention such an imbalance likewise does not occur. That part of the acoustic wave proceeding from the transducer 4 which proceeds adjacent to the upper edge 16' impinges the finger sub-pieces 412 there. The energy component of the acoustic wave that impinges the additional sub-pieces 412, however, is just as great as that energy component of the acoustic wave by which energy of the acoustic wave (proceeding in direction 6') impinging the finger sub-pieces 212 is reduced. The efficiency of the sub-pieces 212 diminished in the arrangement of FIG. 5 for this reason is thus compensated by the effect of the sub-pieces 412. The size and direction of the displacement of the sub-pieces 412 (relative to the central position that applies given no finger weighting) which is to be provided is exactly the same as in the case of the sub-pieces 212 for this reason. The sub-pieces 412 thus represent continuations or extensions of the sub-pieces 212 over the opposite, upper edge 16 of a reflector structure 11 in FIG. 1 which are interrupted by the respective sub-piece 112. The same is true of the sub-pieces 312 which represent continuations or extensions of the sub-pieces 112. Given the deviating direction 6' which has been assumed here, however, (relative to the direction 6) these sub-pieces 312 do not become effective. In the same fashion as described with respect to the sub-pieces 412, however, the sub-pieces 312 would become effective if the acoustic wave proceeding from the transducer 4 were to proceed obliquely deviating from the rated direction 6 in a downward direction.

These continuations 412, 312 are to be at least dimensioned with such a length that the finger sub-pieces 412 situated at the right-hand end of the reflector structure still cover the acoustic wave proceeding in the reflector structure 111 with the width a (but erroneously in direction 6'), in other words the sub-pieces 412 at the right-hand end of the reflector structure also cover at least up to the edge 16' of the acoustic wave proceeding in the faulty direction 6'. A corresponding dimensioning is provided for the sub-pieces 312. As shall be described in yet greater detail with respect to FIG. 6, the sub-pieces 412 or 312 should not be made longer than the finger sub-pieces 212 or 112.

Even given reflection with the prescribed angle, the acoustic wave from the direction 6' would enter into the second reflector structure 113 with the direction 8' deviating from the assumed rated direction 8. As a consequence of the additional sub-pieces 314 and 414 of the invention at the respective outer edges of the reflector structure, with this reflector structure 113 the balance for the finger weighting is preserved by mutual dislocation of finger sub-pieces 114, 214. This is true even when the direction 8' of the acoustic wave deviates, as assumed, from the direction 8 of impingement. This also applies for that case in which the reflection at the structure 111 in fact occurs with an angle differing from 90° at the fingers 12 or at the finger sub-pieces, and at the additionally provided sub-pieces 312 or 412 of the invention.

As may be seen from FIG. 5, the acoustic wave proceeds into the output transducer 5 in accordance with the oblique direction 7' deviating from the rated direction 7 (leaving diffraction effects out of consideration). This output transducer 5 has the reception characteristic with the width b which can generally be equal to the width a. The transducer 5 thus receives the acoustic wave incident with the direction 7'. This is true because in accordance with the invention, the fingers 14 (or the sub-pieces 114, 214, 314, and 414 which, taken together, respectively form a respective weighted finger) of the reflector structure 113 are all of such length, or the entire reflector structure 113 is dimensioned of such width, that the strip indicated in FIG. 5 having the edges 17', 17" of the width b still always proceeds within the overall width c of the reflector structure 113. This occurs even given a directional deviation that is at a maximum up to the direction 7' (relative to the rated direction 7). The wave received in the transducer 5 having the width b is influenced in the reflector 111 as a consequence of the finger weighting provided therein. This influencing—because of the inventive design of this reflector structure 111—is independent of a directional deviation from the direction 6 up to a maximum direction 6' (whereby this direction 6' is assumed as the maximum of a possible deviation). Moreover, this wave (given a weighting of the reflector structure 113) received in the transducer 5 is also influenced by the weighting (i.e. the arrangement of the sub-pieces 114, 214, 314, and 414) of this second reflector structure 113. This influencing, due to the weighting of the reflector structure 113, is also independent with respect to directional deviation within a directional deviation from the rated direction 7 up to a maximum direction 7' (which is assumed as the maximum of a possible directional deviation). This is again due to the design of the reflector structure 113 of the invention (in comparison to the reflector structure 13 of FIG. 1). As a consequence of the invention, a wave that has proceeded somewhere between the directional paths 6, 8, and 7 on the one hand and 6', 8', and 7' on the other hand (or 6, 8 and 7 on the one hand and 6, 8', 7' on the other hand) has respectively experienced one and the same weighting influence in the reflector structures 111 and/or 113.

The sub-pieces 414 are continuations or extensions of the finger sub-pieces 214, and the finger sub-pieces 314 are continuations or extensions of the finger sub-pieces 114 with respect to their function as fingers weighted by dislocation.

Given the embodiment of FIG. 5, the reflector structure 111 has reflector fingers 12 (which are composed of the respective sub-pieces 112, 212, 312, and 412 when the finger is weighted) which are aligned in an oblique direction relative to the alignment of the fingers of the (input) transducer 4. The angle of this oblique positioning of the reflector fingers 12 results from the desired path of the directions 6 and 8, or from the angle between these directions 6 and 8. Only for the sake of completeness, let it again be pointed out that an anisotropic behavior of the material of the substrate is also to be considered for the selection of this angle of the oblique positioning of the reflector fingers.

Deviating from the illustration of FIG. 5, when the reflector fingers 12 are given an alignment which is parallel to the alignment of the fingers of the transducer 4 (see FIG. 6), then an embodiment with a wave reflected onto itself is obtained. Such an embodiment is referred to as an in-line RAC. Given such an in-line RAC, the input transducer referenced 4 in FIG. 5 can also be employed as an output transducer. In general, such in-line RAC arrangements are executed such that reflector structures as described above with 180° reflection (i.e. with reflector fingers aligned parallel to the transducer fingers) are provided at both sides of such an input and output transducer 4', namely in both directions of the wave emission of such a transducer. Given such an in-line RAC arrangement, the reflector structure—apart from this parallel alignment of the reflector fingers to those of the transducer—can be designed exactly like a structure 111 (or respectively 113) of FIG. 5 with respect to the division of the individual reflector fingers into sub-pieces 112, 212, and their continuations 312 and 412. Such a reflector structure then has the same finger weighting as the reflector structure 111 and, in this regard, the same dynamic systems behavior for the wave.

Figure 6:
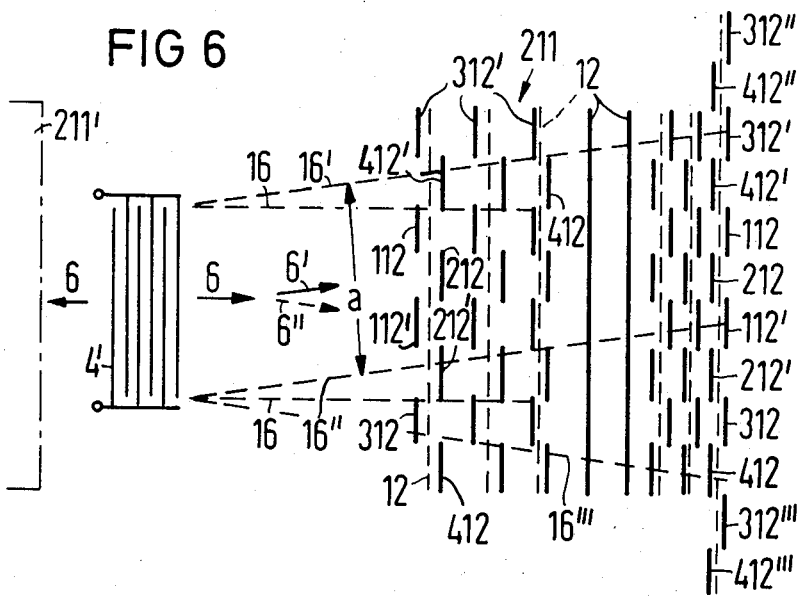
FIG. 6 is an embodiment of the invention wherein a plurality of sub-pieces are provided outside of a primary acoustic wave path.

FIG. 6 relates to an in-line RAC of which the input and output transducer 4' and a section of a reflector structure 211 disposed at the right-hand side of the transducer 4' are shown. It is only schematically indicated that a corresponding reflector structure can be positioned at the left-hand side of the transducer 4' which, in particular, can be identical to the reflector structure 211. The details described above relating to an in-line RAC also apply to the embodiment of FIG. 6, which shows a further development of the invention.

As shown in FIG. 6, a reflector finger divided into sub-pieces 112, 212 and 112', 212', and which is weighted by a respective dislocation of these sub-pieces relative to one another or relative to the position of the corresponding unweighted reflector finger, is divided within the strip defined by limits 16 such that there are two sub-pieces 112, 112' and two sub-pieces 212, 212'. The dislocation of these two sub-pieces corresponds exactly to the same weighting given the embodiment according to FIG. 5 having reflector fingers respectively divided only once (within the strip defined by the limits 16). This three-fold sub-division (within the strip 16) in FIG. 6 leads to the fact that, in case of an irregular intensity distribution within the width of the wave emitted by the transducer 4', this wave experiences a slight imbalance of the weighting within the reflector structure. This observation already applies when the wave emitted by the transducer 4' is emitted exactly in the direction 6, i.e. proceeds as desired within the strip formed by the limits 16.

The division shown in FIG. 6 into respectively two sub-pieces 112, 112' and 212, 212' within the strip formed by the limits 16 can occur even more finely with a corresponding technological expenditure, into, for example, six, eight, ten . . . sub-pieces 112 and 212. In this case, this division comprises a respective sequence of sub-pieces in transverse direction (transverse relative to direction 6). This sequence can have a periodicity per se within the limits 16.

For the continuation of a reflector finger beyond the limits 16 according to the invention, an at least partial repetition of the sequence that exists within the limits 16 for this corresponding reflector finger is provided. These repetitions are to be continued at least up to the edges 16', 16''', as may be derived from the drawing figure. The sub-piece 412' with which a reflector finger is continued beyond the upper edge 16 is dimensioned just as long, and is disposed in offset fashion, just as far as the sub-piece 212' abutting the lower edge 16. Correspondingly, the sub-piece 312' continuing further at the top follows with a length and an offset as in the sub-piece 112'. An analogous continuation of the sequence of sub-pieces 212', 112', 212, 112 present within the edges 16, which is described above for the edge 16, is also provided for the continuation of the corresponding reflector finger below the edge 16. The corresponding sequence of sub-pieces 112, 212, 112', 212' is continued there by a sequence of sub-pieces 312, 412 and, under given conditions, 312'', 412''.

FIG. 6 illustrates the case where the wave emitted from the transducer 4' with the width a proceeds (undesirably per se) in the reflector structure 211 in a deviating direction 6'. As may be seen from FIG. 6, the wave proceeding in direction 6' from the transducer 4' first covers the sub-pieces 412' above the upper edge 16 to an increasing degree, namely exactly to the same degree in accordance with the invention to which the sub-pieces 212' at the lower edge 16 are increasingly no longer covered by the wave (see the boundary 16''). Given a correspondingly greater deviation, particularly in the region of the outer end of the reflector structure 211, this wave proceeding in direction 6' even impinges sub-pieces 312' which are provided above the upper edge 16 in accordance with the teaching of the invention. The sub-pieces 412' situated above the edge 16 are then already fully covered and, as compensation therefor, the sub-pieces 212' adjacent to the lower edge 16 at the end are no longer covered. Over the further path, the sub-pieces 112' of the lower half of the strip defined by the edge 16 are increasingly no longer covered at the end, namely to the same degree with which the sub-pieces 312' above the edge 16 are increasingly covered by the wave.

Should the two finger sub-pieces 412' and 312' (provided, for example, outside of the upper edge 16) still not suffice in order to cover the strip having the edges 16', 16'', then further sub-pieces 412'' and 312'' (see the last two reflector fingers at the right-hand end of FIG. 6) are provided, these being the repetition of the sub-pieces 212, 112. I.e., that the entire sequence 212', 112', 212, 112 is then repeated there as a period. Accordingly, when only the sub-pieces 412' and 312', or only the sub-pieces 412', 312' or 312, 412 are added, the period of the sequence of the sub-pieces 312, 412, 312', 412' of the main track is then only continued in a fundamental manner.

How the balance of the weighting even for a wave undesirably proceeding in the direction 6' is retained with the invention is clear from the above explanation.

As already mentioned, the wave which has proceeded from the transducer 4' into the reflector structure 211 returns back into the transducer 4' turned on itself after conclusion of the reflection at the unweighted reflector fingers 12 and at the weighted reflector fingers. Despite an oblique direction 6'—leaving other disturbances of a higher order out of consideration—the wave front of the wave remains parallel to the alignment of the fingers of the trausducer 4' and, given an in-line RAC, also remains parallel to the alignment of the reflector fingers of the reflector structure 211.

In the above description, deviations toward the top (6, 6' and 7, 7' or 16, 16' and 16'') have been discussed in specific detail. A corresponding edge for a maximum possible directional deviation 6'', 7'' toward the bottom has been shown with 16'''. Both outermost edges 16' and 16''' are to be correspondingly taken into consideration for the invention (as shown in the drawing FIGS. 5 and 6). The edge 17''' indicates the corollary to structure 113.

The continuation of the sub-piece 112' and of the sub-piece 212' corresponding to the sub-pieces 312'' and 412'' (i.e., the extension of the corresponding reflector finger beyond the sub-piece 412) is first comprised in the sub-piece 312''' and then in the sub-piece 412'''.

The illustrative embodiments show digit-shaped reflector elements 12, 13 and 112, 212 or their sub-pieces 112, 212, 312 . . . which are preferably metallization strips that have been applied to the substrate surface. A piezo-electric substrate is normally provided when metallization strips are used. Elements (grooves) provided as trenches or troughs can also be employed for the reflector elements. "Dots" may also be utilized as reflector elements.

Although various minor changes and modifications might be proposed by those skilled in the art, it will be understood that I wish to include within the claims of the patent warranted hereon all such changes and modifications as reasonably come within my contribution to the art.

I claim as my invention:

1. An electronics component operating with reflected accoustic waves on a substrate wherein a transducer is provided for inputting and/or outputting the waves relative to a reflector structure, comprising:
   (a) a reflector structure formed of a plurality of reflector fingers, at least some of which are weighted;
   (b) a principal path of the acoustic waves having first and second outer edges and extending along the substrate and through said reflector structure given absence of distortions in the component;
   (c) a maximum anticipated deviation path of the acoustic waves occurring laterally offset to either side of said principal path given distortions and defining first and second deviated outer edges respectively outwardly of the first and second principal path edges;
   (d) all reflector fingers extending at least to the first and second deviated outer edges;
   (e) at least one weighted reflector finger which is divided so as to create sub-pieces offset relative to one another in a principal wave propagation direction by a dimension corresponding to a prescribed weighting;

(f) associated with said at least one divided reflector finger additional reflector finger sub-pieces which extend said divided reflector finger outwardly of the first and second edges of said principal path;

(g) a weighting division and dislocation of the divided reflector finger within the principal path being continued outwardly from the first and second edges of the principal path as an at least fundamentally periodically repeated sequence; and (h) said continued sequence being provided at least up to said first and second deviated edges.

2. An electronics component according to claim 1 wherein only one additional reflector finger sub-piece is provided outside of the first and second opposite edges of the principal path, and the weighting offset of the one corresponding additional reflector finger sub-piece is identical to the weighting offset of the reflector finger sub-piece within and adjacent to the respective first or second edge of the principal path.

3. An electronics component according to claim 1 wherein at least one unweighted reflector finger is provided which extends at least to the first and second outer edges of the deviated path.

4. An electronics component according to claim 1 wherein said at least one weighted reflector finger is provided so as to create sub-pieces, such sub-pieces being offset relative to one another and to each side of a respective unweighted position, and wherein these sub-pieces are parallel to one another.

5. An electronics component operating with reflected acoustic waves on a substrate wherein a transducer is provided for inputting and/or outputting the waves relative to a reflector structure, comprising:

(a) a reflector structure formed of a plurality of reflector fingers at least some of which are weighted;

(b) a principal path of the acoustic waves having first and second outer edges being defined along the substrate and through said reflector structure given absence of distortions in the component;

(c) a maximum anticipated deviation path of the acoustic waves occurring laterally offset to either side of said principal path given distortions and defining first and second deviated outer edges respectively outwardly of the first and second principal path edges;

(d) at least one weighted reflector finger which is divided so as to create first and second sub-pieces offset relative to one another in a principal wave propagation direction by a dimension corresponding to a prescribed weighting;

(e) associated with said at least one divided reflector finger third and fourth reflector finger sub-pieces which extend said divided reflector finger outwardly of the first and second edges of the principal path; and (f) said third and fourth reflector finger sub-pieces being positioned substantially outwardly of the first and second edges of said principal path and lying at least partially within a region between the respective first and second principal path outer edges and the respective first and second deviated path edges at each side of the principal path.

6. An electronics component according to claim 5 wherein at least one unweighted reflector finger is provided extending at least to the first and second deviated outer edges.

7. An electronics component according to claim 5 wherein said at least one weighted reflector finger which is divided to create first and second sub-pieces has such first and second sub-pieces offset relative to one another and also to each side of a respective unweighted postion, and wherein said first and second sub-pieces are parallel to one another.

* * * * *